(12) United States Patent
Park et al.

(10) Patent No.: US 9,775,244 B2
(45) Date of Patent: Sep. 26, 2017

(54) MULTILAYER CERAMIC COMPONENT HAVING METAL FRAMES CONNECTED TO EXTERNAL ELECTRODES THEREOF AND BOARD HAVING THE SAME

(71) Applicant: SAMSUNG ELECTRO-MECHANICS CO., LTD., Suwon-Si, Gyeonggi-Do (KR)

(72) Inventors: Heung Kil Park, Suwon-Si (KR); Young Ghyu Ahn, Suwon-Si (KR); Sang Soo Park, Suwon-Si (KR); Soon Ju Lee, Suwon-Si (KR); Kyoung Jin Jun, Suwon-Si (KR); So Yeon Song, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/940,946

(22) Filed: Nov. 13, 2015

(65) Prior Publication Data

US 2016/0217928 A1 Jul. 28, 2016

(30) Foreign Application Priority Data

Jan. 26, 2015 (KR) .................. 10-2015-0012013

(51) Int. Cl.
*H05K 1/16* (2006.01)
*H05K 1/11* (2006.01)
*H01G 2/06* (2006.01)
*H01G 4/228* (2006.01)

(52) U.S. Cl.
CPC .............. *H05K 1/111* (2013.01); *H01G 2/06* (2013.01); *H01G 4/228* (2013.01)

(58) Field of Classification Search
CPC .......... H05K 1/111; H01G 2/06; H01G 4/228
USPC .................. 174/260, 250, 255–258, 261
See application file for complete search history.

(56) References Cited

U.S. PATENT DOCUMENTS

2010/0123995 A1  5/2010  Otsuka et al.
2010/0188798 A1  7/2010  Togashi et al.

FOREIGN PATENT DOCUMENTS

JP        2010-123614 A     6/2010
KR   10-2005-0093878 A     9/2005
KR   10-2010-0087622 A     8/2010

OTHER PUBLICATIONS

Machine Translation of Japanese Patent Publication No. JP 2012-33651A (Komatsu Takashi et al., Feb. 16, 2012).*

* cited by examiner

*Primary Examiner* — Tremesha S Willis
(74) *Attorney, Agent, or Firm* — McDermott Will & Emery LLP (57) ABSTRACT

A multilayer ceramic component includes a multilayer ceramic capacitor including a ceramic body including a plurality of first and second internal electrodes having respective dielectric layers interposed therebetween, and first and second external electrodes respectively including first and second connection portions, and first and second band portions extended from the first and second connection portions, and first and second metal frames respectively including first and second upper horizontal portions, first and second lower horizontal portions, and first and second inclined support portions diagonally connecting the first and second upper horizontal portions and the first and second lower horizontal portions, respectively.

20 Claims, 7 Drawing Sheets

MULTILAYER CERAMIC COMPONENT HAVING METAL FRAMES CONNECTED TO EXTERNAL ELECTRODES THEREOF AND BOARD HAVING THE SAME

CROSS-REFERENCE TO RELATED APPLICATION

This application claims the priority and benefit of Korean Patent Application No. 10-2015-0012013 filed on Jan. 26, 2015, with the Korean Intellectual Property Office, the disclosure of which is incorporated herein by reference.

BACKGROUND

The present disclosure relates to a multilayer ceramic component and a board having the same.

Exemplary electronic components containing a ceramic material include capacitors, inductors, varistors, thermistors, and the like, as well as piezoelectric elements.

A multilayer ceramic capacitor (MLCC), a representative ceramic electronic component, may be used in various types of electronic apparatus due to advantages thereof such as small size, high capacitance, and ease of mounting.

Here, a multilayer ceramic capacitor is a chip-type condenser mounted on the boards of several types of electronic products, such as image display devices of liquid crystal displays (LCD), plasma display panels (PDP), and the like, in addition to devices such as computers, personal digital assistants (PDA), and cellular phones, serving to charge electricity therein or discharge electricity therefrom.

The multilayer ceramic capacitor may have a structure in which a plurality of dielectric layers and internal electrodes having different polarities are alternately stacked.

Here, since the dielectric layers have piezoelectric properties, when a direct current (DC) or alternating current (AC) voltage is applied to the multilayer ceramic capacitor, a piezoelectric phenomenon between the internal electrodes may occur, generating periodic vibrations due to a volume of a ceramic body being expanded and contracted, depending on a frequency.

These vibrations may be transferred to a board through external electrodes of the multilayer ceramic capacitor and solders connecting the external electrodes and the board to each other, such that the entirety of the board may act as a sound reflecting surface to generate vibration sound, noise.

The vibration sound may correspond to an audio frequency within a range of 20 to 20,000 Hz, causing listener discomfort. The vibration sound causing listener discomfort as described above is commonly known as acoustic noise.

Further, in recently released electronic devices, mechanical components may be silent, such that the acoustic noise generated in the multilayer ceramic capacitor as described above may be more prominent.

In a case in which the device is operated in a silent environment, a user may believe such acoustic noise to be abnormal sound, and may conclude that a fault has occurred in the device.

In addition, in a device having an audio circuit, the acoustic noise may be overlapped with an audio output, such that sound quality of the device may be deteriorated.

SUMMARY

An aspect of the present disclosure may provide a multilayer ceramic component having decreased acoustic noise, and a board having the same.

According to an aspect of the present disclosure, a multilayer ceramic component may include: a multilayer ceramic capacitor including a ceramic body including a plurality of first and second internal electrodes having respective dielectric layers interposed between the plurality of first and second internal electrodes, to be alternately exposed to both surfaces of the ceramic body in a length direction, and first and second external electrodes respectively including first and second connection portions formed on both surfaces of the ceramic body in the length direction, and connected to the first and second internal electrodes, respectively, and first and second band portions extended from the first and second connection portions, respectively, to cover portions of surfaces of the ceramic body in a width direction and a thickness direction; and first and second metal frames respectively including first and second upper horizontal portions disposed on one surfaces of the first and second band portions in the thickness direction, respectively, first and second lower horizontal portions disposed to be spaced apart from the first and second upper horizontal portions, respectively, in an opposite direction to a direction toward the first and second band portions, and first and second inclined support portions diagonally connecting the first and second upper horizontal portions and the first and second lower horizontal portions to each other, respectively.

According to another aspect of the present disclosure, a board having a multilayer ceramic component may include a circuit board on which first and second electrode pads are disposed, and the multilayer ceramic component as described above mounted on the circuit board such that the first and second lower horizontal portions of the first and second metal frames are bonded to the first and second electrode pads, respectively.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Component

A multilayer ceramic component according to an exemplary embodiment in the present disclosure may include metal frames disposed between external electrodes of a multilayer ceramic capacitor and a board. The metal frames may have diagonal inclined support portions.

Here, the metal frames may be bonded to the external electrodes through conductive adhesive layers.

In addition, the inclined support portions may be inclined from a middle portion of the multilayer ceramic capacitor toward ends thereof in a length direction or may be inclined from the ends of the multilayer ceramic capacitor inwardly toward the middle portion thereof.

The inclined support portions may also be inclined in a width direction of the multilayer ceramic capacitor as a further example.

Figure 1:
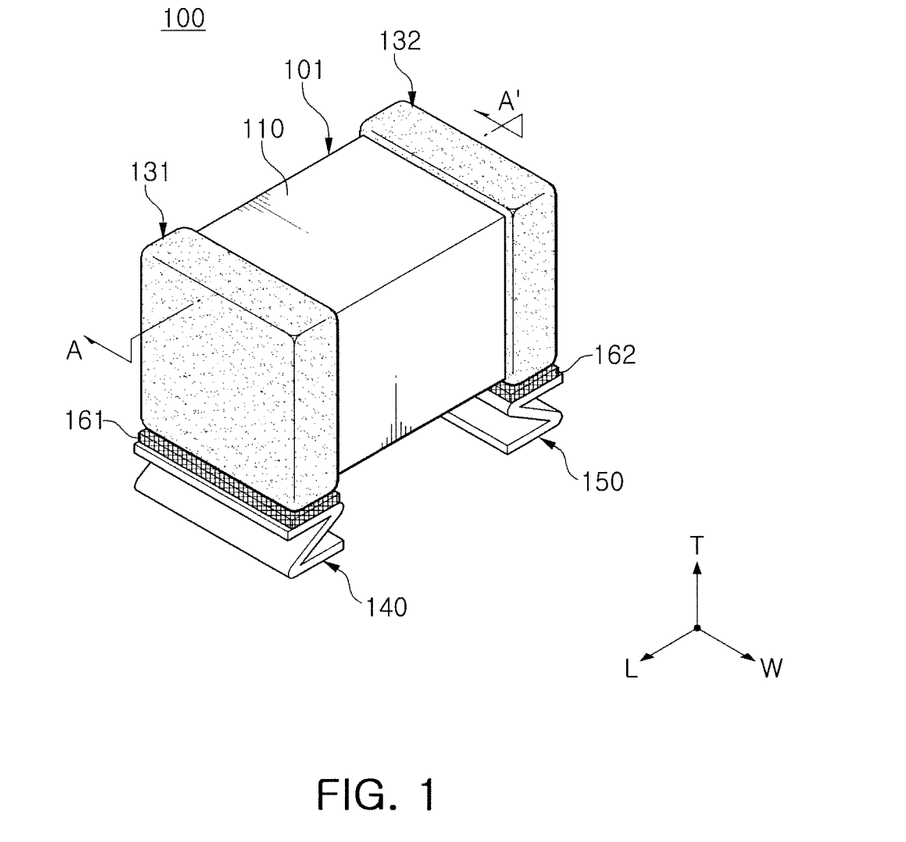
FIG. 1 is a perspective view schematically illustrating a multilayer ceramic component having metal frames according to an exemplary embodiment in the present disclosure.
Figure 2:
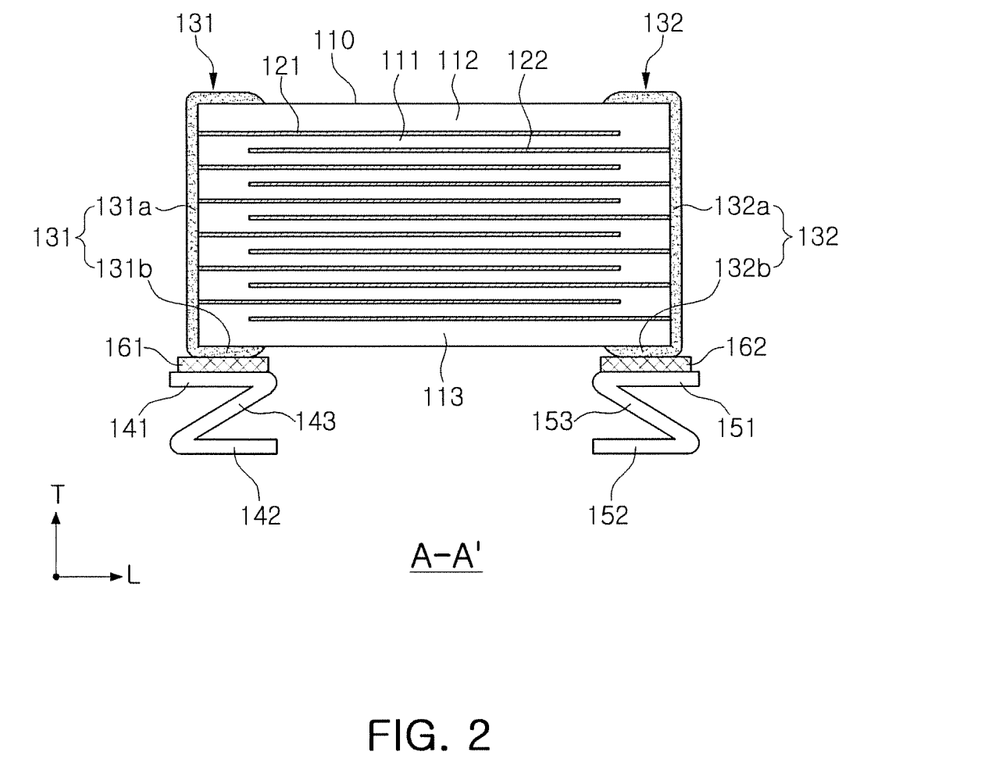
FIG. 2 is a cross-sectional view of structures of internal electrodes of the multilayer ceramic component according to an exemplary embodiment in the present disclosure taken along line A-A' of FIG. 1.
Figure 3:
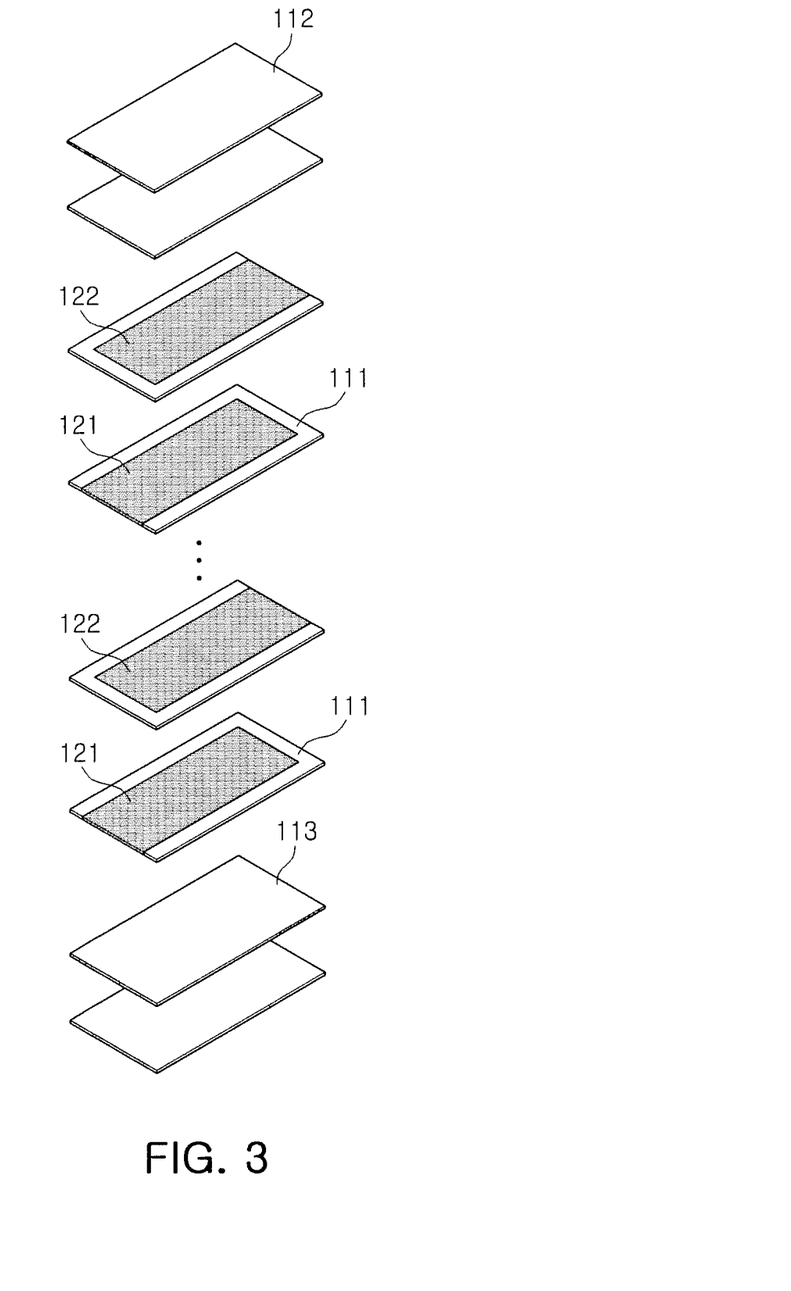
FIG. 3 is an exploded perspective view illustrating structures of the internal electrodes of FIG. 2.

FIG. 1 is a perspective view schematically illustrating a multilayer ceramic component according to an exemplary embodiment in the present disclosure, FIG. 2 is a cross-sectional view of structures of internal electrodes of the multilayer ceramic component according to an exemplary embodiment in the present disclosure taken along line A-A' of FIG. 1, and FIG. 3 is an exploded perspective view illustrating structures of the internal electrodes of FIG. 2.

Referring to FIGS. 1 through 3, a multilayer ceramic component 100 according to the present exemplary embodiment may include a multilayer ceramic capacitor 101 and first and second metal frames 140 and 150.

The multilayer ceramic capacitor 101 according to the present exemplary embodiment may include a ceramic body 110 including a plurality of dielectric layers 111 and a plurality of first and second internal electrodes 121 and 122, and first and second external electrodes 131 and 132.

The ceramic body 110 may be formed by stacking the plurality of dielectric layers 111 in a thickness direction T in parallel to a direction in which the first and second metal frames 140 and 150 are disposed and then sintering the dielectric layers 111.

Here, respective adjacent dielectric layers 111 of the ceramic body 110 may be integrated with each other such that that boundaries therebetween may not be readily apparent to the naked eye.

In addition, the ceramic body 110 may have a hexahedral shape. However, a shape of the ceramic body is not limited thereto.

In the present exemplary embodiment, for convenience of explanation, upper and lower surfaces of the ceramic body 110 refer to surfaces of the ceramic body 110 opposing each other in the thickness direction T in which the dielectric layers 111 of the ceramic body 110 are stacked, first and second end surfaces of the ceramic body 110 refer to surfaces of the ceramic body 110 connecting the upper and lower surfaces to each other and opposing each other in a length direction L, and first and second side surfaces of the ceramic body 110 refer to surfaces of the ceramic body 110 vertically intersecting the first and second end surfaces and opposing each other in a width direction W.

In addition, the ceramic body 110 may have an upper cover layer 112 formed to a predetermined thickness on a first or second internal electrode positioned uppermost in the ceramic body and a lower cover layer 113 formed below a first or second internal electrode positioned lowermost in the ceramic body.

The upper cover layer 112 and the lower cover layer 113 may have the same composition as that of the dielectric layers 111 and may be formed by stacking one or more dielectric layers that do not include internal electrodes on an internal electrode of the ceramic body 110 positioned uppermost in the ceramic body and beneath an internal electrode of the ceramic body 110 positioned lowermost in the ceramic body, respectively.

The dielectric layer 111 may contain a high-k ceramic material, for example, a barium titanate ($BaTiO_3$)-based ceramic powder, or the like. However, a material of the dielectric layer 111 is not limited thereto.

An example of the barium titanate ($BaTiO_3$)-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$ or the like, in which Ca, Zr, or the like, is partially dissolved in $BaTiO_3$. However, an example of the barium titanate ($BaTiO_3$)-based ceramic powder is not limited thereto.

In addition, the dielectric layer ill may further contain one or more of a ceramic additive, an organic solvent, a plasticizer, a binder, and a dispersant.

As the ceramic additive, for example, a transition metal oxide or carbide, a rare earth element, magnesium (Mg), aluminum (Al), or the like, may be used.

The first and second internal electrodes 121 and 122 may be formed on ceramic sheets forming the dielectric layers 111, stacked in the thickness direction T, and then fired, such that they are alternately disposed in the ceramic body 110 in the thickness direction T with respective dielectric layers 111 interposed therebetween.

The first and second internal electrodes 121 and 122, which have different polarities, may be disposed to face each other in a direction in which the dielectric layers 111 are stacked and may be electrically insulated from each other by the dielectric layers 111 disposed therebetween.

One ends of the first and second internal electrodes 121 and 122 may be exposed through first and second end surfaces of the ceramic body 110 in the length direction L, respectively.

In addition, the ends of the first and second internal electrodes 121 and 122 alternately exposed through the first and second end surfaces of the ceramic body 110 in the length direction L may be electrically connected to the first and second external electrodes 131 and 132, respectively, on the first and second end surfaces of the ceramic body 110 in the length direction L.

Here, the first and second internal electrodes 121 and 122 may be formed of a conductive metal, nickel, a nickel alloy, or the like, for example. However, materials of the first and second internal electrodes 121 and 122 are not limited thereto.

Therefore, when predetermined voltages are applied to the first and second external electrodes 131 and 132, electric charges may be accumulated between the first and second internal electrodes 121 and 122 facing each other. In this case, capacitance of the multilayer ceramic capacitor 101 may be in proportion to an area of a region in which the first and second internal electrodes 121 and 122 are overlapped with each other in the direction in which the dielectric layers 111 are stacked.

The first and second external electrodes 131 and 132 may be disposed on the first and second end surfaces of the ceramic body 110 in the length direction L, respectively, and may include first and second connection portions 131*a* and 132*a* and first and second band portions 131*b* and 132*b*, respectively.

The first and second connection portions 131*a* and 132*a* may cover the first and second end surfaces of the ceramic body 110 in the length direction L, respectively, and may be electrically connected to exposed ends of the first and second internal electrodes 121 and 122, respectively.

The first and second band portions 131*b* and 132*b* may be extended from the first and second connection portions 131*a* and 132*a*, respectively, to cover portions of the lower surface of the ceramic body 110, which is a mounted surface of the ceramic body 110, or portions of a circumferential surface of the ceramic body 110, and serve to improve adhesive strength of the first and second external electrodes 131 and 132.

Here, plating layers (not illustrated) may be formed on the first and second external electrodes 131 and 132.

The plating layers may include first and second nickel (Ni) plating layers respectively formed on the first and second external electrodes 131 and 132 and first and second tin (Sn) plating layers respectively formed on the first and second nickel plating layers, as an example.

The first metal frame 140 may include a first upper horizontal portion 141, a first lower horizontal portion 142, and a first inclined support portion 143.

The first upper horizontal portion 141 may be disposed below a lower surface of the first band portion 131*b* of the first external electrode 131.

The first lower horizontal portion 142 may face the first upper horizontal portion 141 in the thickness direction T and be disposed to be spaced apart from the first upper horizontal portion 141 downwardly by a predetermined interval.

The first inclined support portion 143 may diagonally connect the first upper horizontal portion 141 and the first lower horizontal portion 142 to each other in a diagonal direction. Thus, the first metal frame 140 including the first upper horizontal portion 141, the first lower horizontal portion 142, and the first inclined support portion 143 connected therebetween may have a Z-shape.

The first inclined support portion 143 may diagonally connect an inner end of the first upper horizontal portion 141 in the length direction L and an outer end of the first lower horizontal portion 142 in the length direction L to each other. Here, two space parts facing each other in the length direction L may be formed on both sides of the first inclined support portion 143.

Here, portions of the space parts open toward ends of the ceramic body 110 in the length direction L may serve as solder pockets in which solder is accommodated at the time of mounting the multilayer ceramic component on the board.

The second metal frame 150 may include a second upper horizontal portion 151, a second lower horizontal portion 152, and a second inclined support portion 153.

The second upper horizontal portion 151 may be disposed below a lower surface of the second band portion 132*b* of the second external electrode 132.

The second lower horizontal portion 152 may face the second upper horizontal portion 151 in the thickness direction T and be disposed to be spaced apart from the second upper horizontal portion 151 downwardly by a predetermined interval.

The second inclined support portion 153 may diagonally connect the second upper horizontal portion 151 and the second lower horizontal portion 152 to each other in the diagonal direction. Thus, the second metal frame 150 including the second upper horizontal portion 151, the second lower horizontal portion 152, and the second inclined support portion 153 connected therebetween may have a Z-shape.

The second inclined support portion 153 may diagonally connect an inner end of the second upper horizontal portion 151 in the length direction L and an outer end of the second lower horizontal portion 152 in the length direction L to each other. Here, two space parts facing each other in the length direction L may be formed on both sides of the second inclined support portion 153.

Here, portions of the space parts open toward ends of the ceramic body 110 in the length direction L may serve as solder pockets in which solder may be accommodated at the time of mounting the multilayer ceramic component on the board.

First and second conductive adhesive layers 161 and 162 may be disposed between the lower surfaces of the first and second band portions 131*b* and 132*b* of the first and second external electrodes 131 and 132 and the first and second upper horizontal portions 141 and 151 of the first and second metal frames 140 and 150, respectively, in order to improve bonding strength therebetween.

The first and second conductive adhesive layers 161 and 162 may be formed of, for example, a high melting-point solder or a conductive paste. However, materials of the first and second conductive adhesive layers 161 and 162 are not limited thereto.

Figure 4:
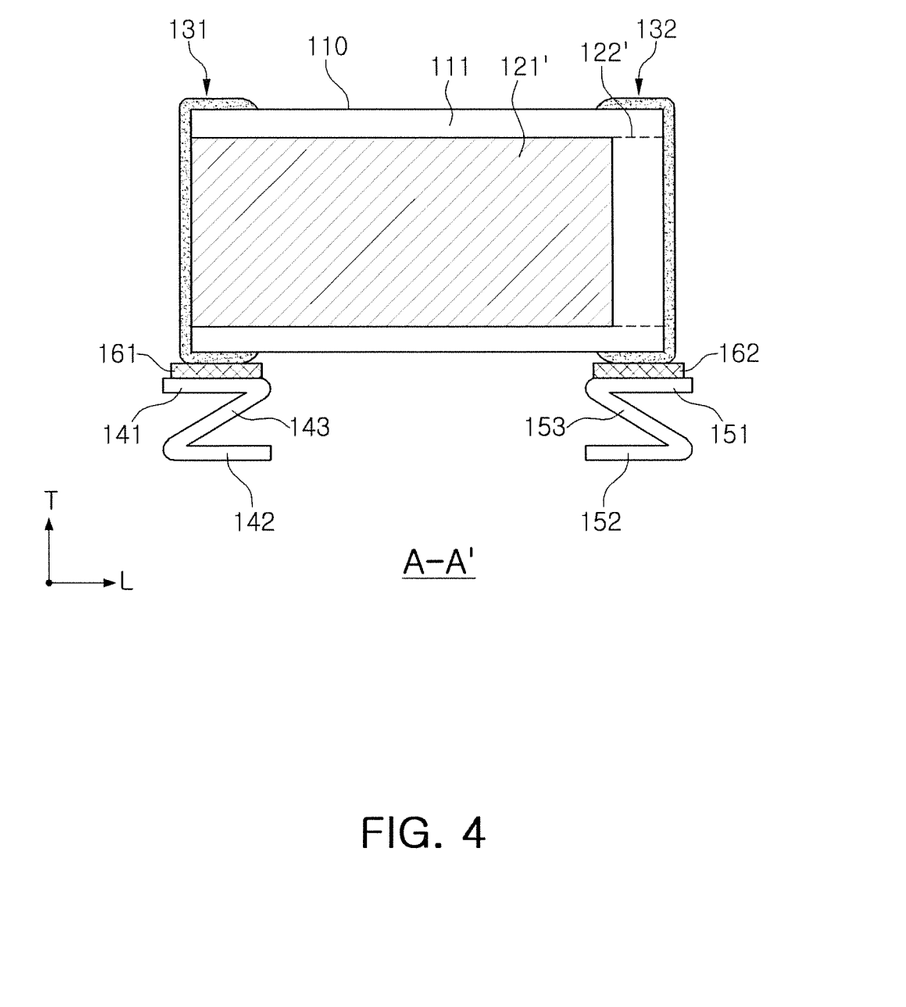
FIG. 4 is a cross-sectional view of another example of structures of internal electrodes of the multilayer ceramic component according to an exemplary embodiment in the present disclosure taken along line A-A' of FIG. 1.
Figure 5:
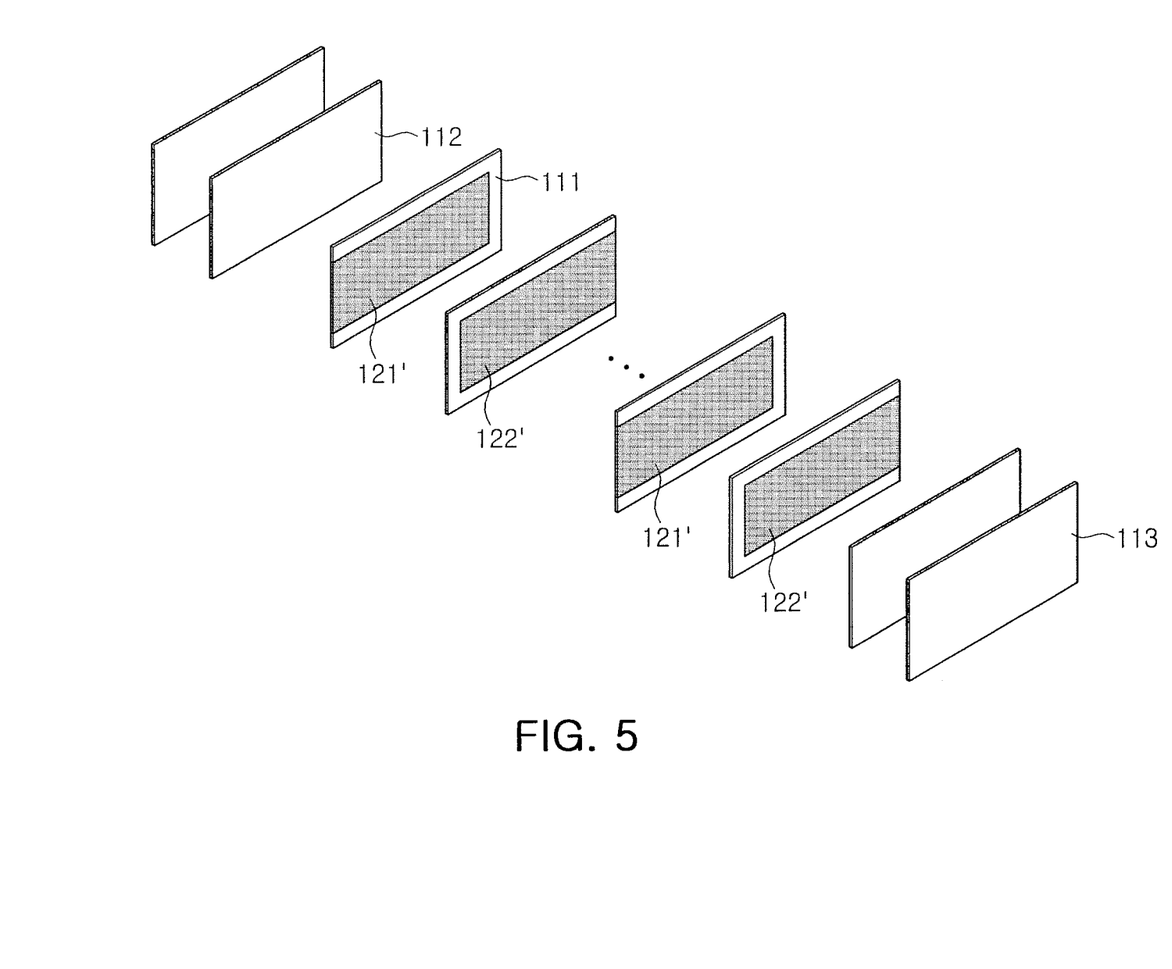
FIG. 5 is an exploded perspective view illustrating structures of the internal electrodes of FIG. 4.

FIG. 4 is a cross-sectional view of another example of structures of internal electrodes of the multilayer ceramic component according to an exemplary embodiment in the present disclosure taken along line A-A' of FIG. 1; and FIG. 5 is an exploded perspective view illustrating structures of the internal electrodes of FIG. 4.

Referring to FIGS. 4 and 5, the ceramic body 110 according to the present exemplary embodiment may be formed by stacking the plurality of dielectric layers 111 in the width direction W perpendicular to a direction in which the first and second metal frames 140 and 150 are disposed.

First and second internal electrodes 121' and 122' may be formed on ceramic sheets forming the dielectric layers 111, stacked in the width direction W, and then fired, such that they are alternately disposed in the ceramic body 110 in the width direction W with respective dielectric layers 111 interposed therebetween.

In addition, the ceramic body 110 may include cover layers 112 and 113 disposed at a predetermined thickness, respectively, on outer surfaces of first or second internal electrodes positioned at the outermost sides of the ceramic body 110 in the width direction W.

Modified Example

Figure 6:
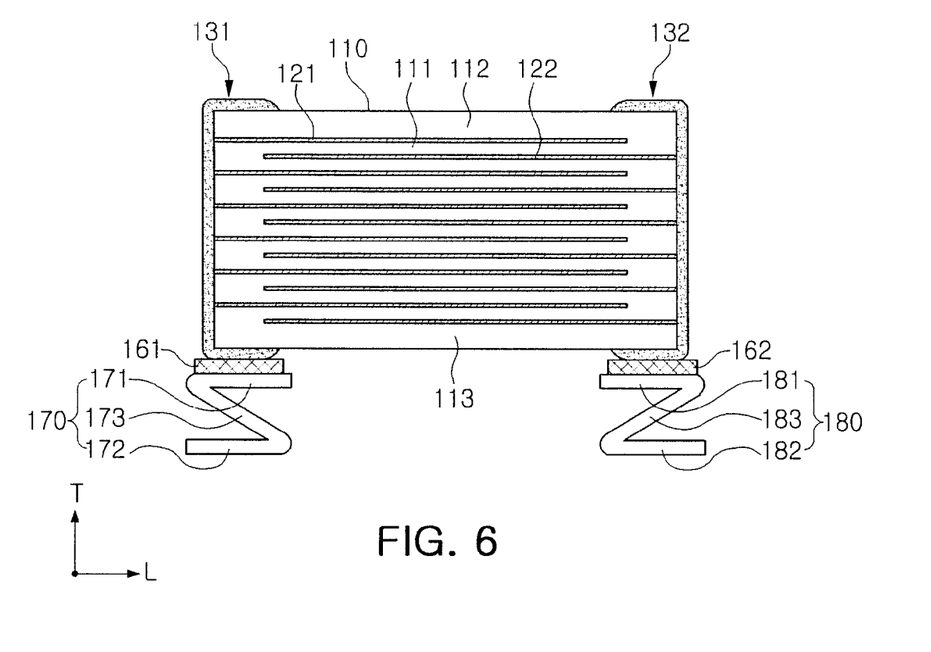
FIG. 6 is a cross-sectional view illustrating another example of metal frames in the multilayer ceramic component according to an exemplary embodiment in the present disclosure.

FIG. 6 is a cross-sectional view illustrating another example of metal frames in the multilayer ceramic component according to an exemplary embodiment in the present disclosure.

Here, since a structure of a multilayer ceramic capacitor 101 is similar to that of the multilayer ceramic capacitor according to the exemplary embodiment described above, a detailed description thereof will be omitted in order to avoid overlapped descriptions, and metal frames modified from the metal frames according to the exemplary embodiment described above will be described in detail.

Referring to FIG. 6, in a first metal frame 170, a first inclined support portion 173 may diagonally connect an outer end of a first upper horizontal portion 171 in the length direction L and an inner end of a first lower horizontal portion 172 in the length direction L to each other. Thus, the first metal frame 170 including the first upper horizontal portion 171, the first lower horizontal portion 172, and the first inclined support portion 173 connected therebetween may have a Z-shape. Here, two space parts facing each other in the length direction may be formed on both sides of the first inclined support portion 173.

In addition, in a second metal frame 180, a second inclined support portion 183 may diagonally connect an outer end of a second upper horizontal portion 181 in the length direction L and an inner end of a second lower horizontal portion 182 in the length direction L to each other. Thus, the second metal frame 180 including the second upper horizontal portion 181, the second lower horizontal portion 182, and the second inclined support portion 183 connected therebetween may have a Z-shape. Here, two space parts facing each other in the length direction L may be formed on both sides of the second inclined support portion 183.

Figure 7:
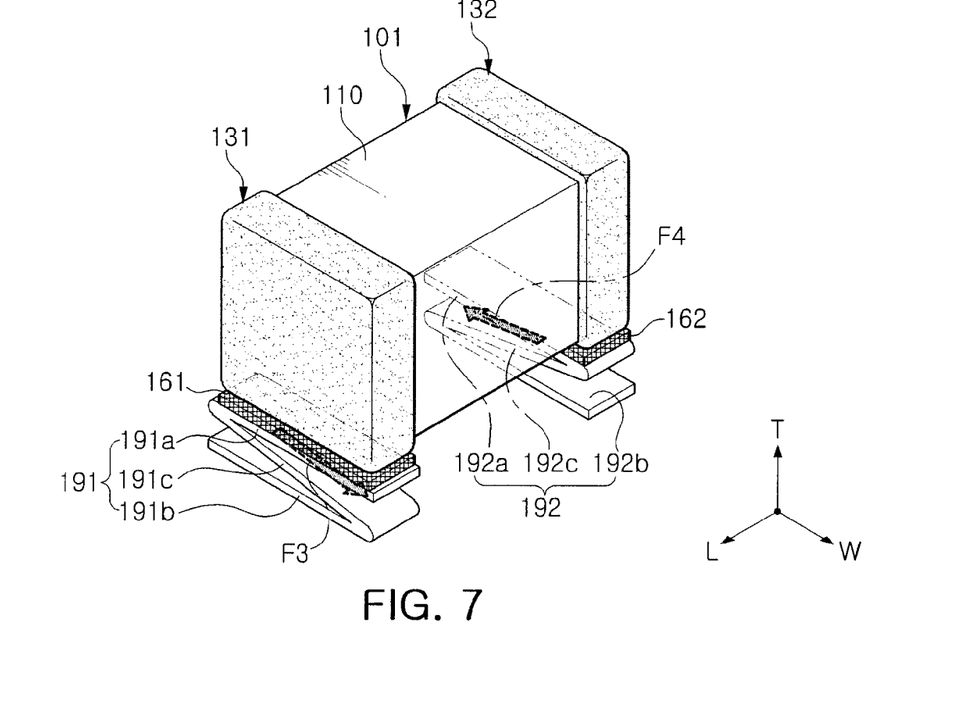
FIG. 7 is a perspective view illustrating another example of metal frames in the multilayer ceramic component according to an exemplary embodiment in the present disclosure.

FIG. 7 is a perspective view illustrating another example of metal frames in the multilayer ceramic component according to an exemplary embodiment in the present disclosure.

Here, since a structure of a multilayer ceramic capacitor 101 is similar to that of the multilayer ceramic capacitor according to the exemplary embodiment described above, a detailed description therefor will be omitted in order to avoid an overlapped description, and metal frames modified from the metal frames according to the exemplary embodiment described above will be described in detail.

Referring to FIG. 7, in a first metal frame 191, a first inclined support portion 191c may connect one end of a first upper horizontal portion 191a in the length direction L and the other end of a first lower horizontal portion 191b in the length direction L to each other, and may be inclined in the width direction W of the ceramic body 110. Here, two space parts facing each other in the width direction W may be formed on both sides of the first inclined support portion 191c.

In addition, in a second metal frame 192, a second inclined support portion 192c may connect one end of a second upper horizontal portion 192a in the length direction L and the other end of a second lower horizontal portion 192b in the length direction L to each other, and be inclined in the width direction W of the ceramic body 110. Here, two space parts facing each other in the width direction W may be formed on both sides of the second inclined support portion 192c.

Here, the first and second inclined support portions 191c and 192c of the first and second metal frames 191 and 192 may be inclined while opposing each other in the width direction W, such that force F3 transferred from the multilayer ceramic capacitor 101 to the first metal frame 191 and force F4 transferred from the multilayer ceramic capacitor 101 to the second metal frame 192 may be asymmetrically applied to the first and second metal frames 191 and 192 in opposite directions to thereby be offset each other. Therefore, acoustic noise may be decreased at the time of mounting the multilayer ceramic component on the board.

Board Having Multilayer Ceramic Component

Figure 8:
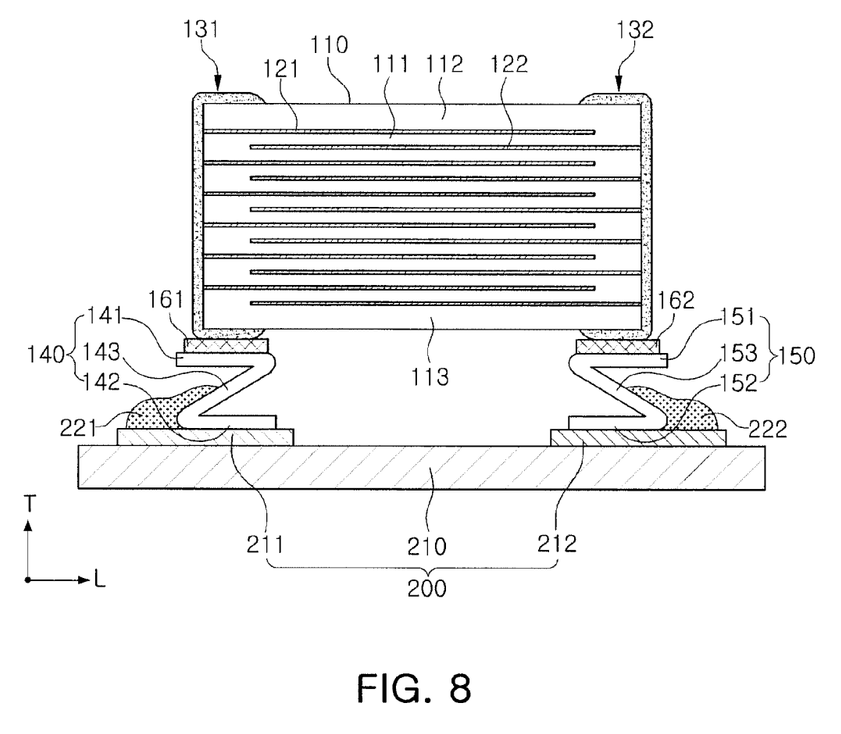
FIG. 8 is a cross-sectional view illustrating a form in which the multilayer ceramic component of FIG. 1 is mounted on a board.

Referring to FIG. 8, a board 200 having a multilayer ceramic component according to an exemplary embodiment in the present disclosure may include a circuit board 210 on which the multilayer ceramic component 100 is horizontally mounted and first and second electrode pads 211 and 212 formed on an upper surface of the circuit board 210 to be spaced apart from each other.

Here, the multilayer ceramic component 100 may be bonded and electrically connected to the board 210 by solders 221 and 222 in a state in which the first and second lower horizontal portions 142 and 152 of the first and second metal frames 140 and 150 are positioned on the first and second electrode pads 211 and 212, respectively, to contact the first and second electrode pads 211 and 212, respectively.

Here, sizes of the first and second electrode pads 211 and 212 may become indices in determining an amount of solders 221 and 222 connecting the first and second metal frames 140 and 150 of the multilayer ceramic component and the first and second electrode pads 211 and 212 to each other, respectively, and a magnitude of the acoustic noise may be controlled depending on the amount of the solders 211 and 212.

When voltages having different polarities are applied to the first and second external electrodes 131 and 132 formed on the first and second end surfaces of the ceramic body 110 in the length direction L in a state in which the multilayer ceramic capacitor 101 is mounted on the circuit board 210, the ceramic body 110 may be expanded and contracted in the thickness direction T due to an inverse piezoelectric effect of the dielectric layers 111, and the first and second end surfaces of the ceramic body 110 in the length direction L on which the first and second external electrodes 131 and 132 are formed may be contracted and expanded as opposed to the expansion and the contraction of the ceramic body 110 in the thickness direction T due to the Poisson effect.

The above-mentioned contraction and expansion may generate vibrations, which are transferred from the first and second external electrodes 131 and 132 to the circuit board 210. Therefore, sound may be radiated from the circuit board 210 as acoustic noise.

The first and second metal frames 140 and 150 according to the present exemplary embodiment may partially absorb mechanical vibrations generated due to piezoelectric properties of the multilayer ceramic capacitor 101 by elastic force to decrease an amount of vibrations transferred to the circuit board 210, thereby decreasing acoustic noise.

Figure 9:
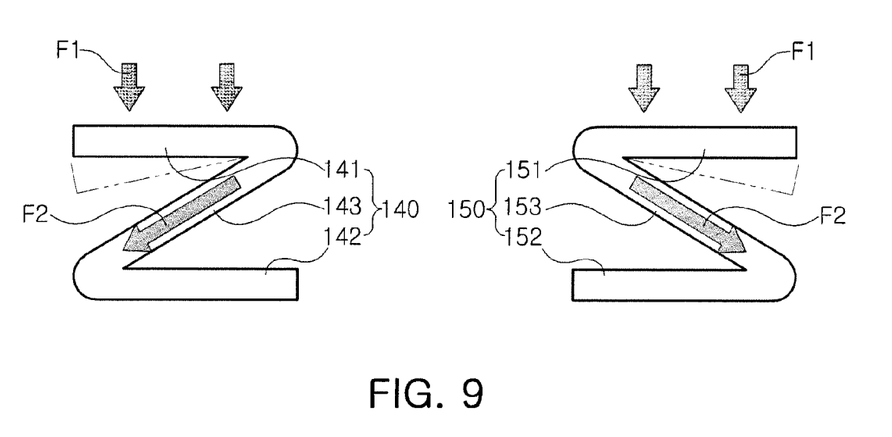
FIG. 9 is a side view schematically illustrating transferring a vibration in the multilayer ceramic component by metal frames, according to an exemplary embodiment in the present disclosure.

Referring to FIG. 9, when vibrations F1 generated in the multilayer ceramic capacitor 101 are transferred to the first and second upper horizontal portions 141 and 151, the first and second upper horizontal portions 141 and 151 may be elastically deformed downwardly, and the first and second inclined support portions 143 and 153 may convert directions of the vibrations transferred from above in a vertical direction into an outer length direction of the first and second metal frames 140 and 150 while serving as supports to disperse the vibrations transferred to the circuit board 210 through the solders 221 and 222 in the vertical direction, thereby effectively decreasing the acoustic noise.

Here, the first and second metal frames 140 and 150 may allow a predetermined interval to be secured between the multilayer ceramic capacitor 101 and the circuit board so that the first and second external electrodes 131 and 132 do not directly contact the solders 221 and 222, respectively, and since the solders 221 and 222 are accommodated in the space parts formed at the first and second inclined support portions 143 and 153, a phenomenon in which the solders 221 and 222 are extended onto the first and second metal frames 140 and 150, respectively, to directly contact the first and second external electrodes 131 and 132, respectively, may be prevented, thereby further decreasing acoustic noise.

In addition, the first and second metal frames 140 and 150 may absorb mechanical stress and external impacts generated due to warpage, or the like, of the circuit board to allow the stress not to be transferred to the multilayer ceramic capacitor 101 and prevent the generation of cracks in the multilayer ceramic capacitor 101.

As set forth above, according to exemplary embodiments in the present disclosure, the elastic force of the metal frames may partially absorb the vibrations transferred through the external electrodes of the ceramic body, a predetermined interval may be secured between the multilayer ceramic capacitor and the board, and the solders may be accommodated in the space parts formed at ends of the inclined support portions connecting the upper horizontal portions and the lower horizontal portions of the metal frames to each other, such that heights of the solders may be lowered and the external electrodes and the solders may not directly contact each other, whereby the acoustic noise may be decreased.

While exemplary embodiments have been shown and described above, it will be apparent to those skilled in the art that modifications and variations could be made without departing from the scope of the present invention as defined by the appended claims.

What is claimed is:

1. A multilayer ceramic component comprising:
a multilayer ceramic capacitor including a ceramic body including a plurality of first and second internal electrodes having respective dielectric layers interposed between the plurality of first and second internal electrodes, to be alternately exposed to opposite surfaces of the ceramic body in a length direction, and first and second external electrodes respectively including first and second connection portions formed on the opposite surfaces of the ceramic body in the length direction, and connected to the first and second internal electrodes, respectively, and first and second band portions extended from the first and second connection portions, respectively, to cover portions of surfaces of the ceramic body in a width direction and a thickness direction; and
first and second metal frames respectively including first and second upper horizontal portions disposed on first and second surfaces of the first and second band portions in the thickness direction, respectively, first and second lower horizontal portions disposed to be spaced apart from the first and second upper horizontal portions, respectively, in a direction away from the first and second band portions, and first and second inclined support portions diagonally connecting the first and second upper horizontal portions and the first and second lower horizontal portions to each other, respectively,
wherein in the first and second metal frames, the first and second inclined support portions are inclined in the width direction of the ceramic body.

2. The multilayer ceramic component of claim 1, further comprising first and second conductive adhesive layers disposed between the first and second surfaces of the first and second band portions in the thickness direction and the first and second upper horizontal portions, respectively.

3. The multilayer ceramic component of claim 2, wherein the first and second conductive adhesive layers are formed of a solder or a conductive paste.

4. The multilayer ceramic component of claim 1, wherein the first and second inclined support portions are formed in directions opposing each other.

5. The multilayer ceramic component of claim 1, wherein the ceramic body includes a plurality of the dielectric layers stacked in parallel with a direction in which the first and second metal frames are disposed.

6. The multilayer ceramic component of claim 5, wherein the ceramic body further includes cover layers disposed on a first or second internal electrode positioned at an uppermost side of the ceramic body and beneath a first or second internal electrode positioned at a lowermost side of the ceramic body, respectively.

7. The multilayer ceramic component of claim 1, wherein the ceramic body includes a plurality of the dielectric layers stacked perpendicularly to a direction in which the first and second metal frames are disposed.

8. The multilayer ceramic component of claim 7, wherein the ceramic body further includes cover layers disposed on outer surfaces of outermost first or second internal electrodes of the ceramic body, respectively.

9. A board having a multilayer ceramic component, comprising:
a circuit board on which first and second electrode pads are disposed;
a multilayer ceramic capacitor including:
a ceramic body having a plurality of first and second internal electrodes alternately exposed to opposite surfaces of the ceramic body in a length direction, and
first and second external electrodes respectively including first and second connection portions formed on the opposite surfaces of the ceramic body in the length direction and connected to the first and second internal electrodes, respectively, and first and second band portions extended from the first and second connection portions, respectively, to cover portions of surfaces of the ceramic body in a width direction and a thickness direction;
first and second metal frames respectively including first and second upper horizontal portions disposed on first and second surfaces of the first and second band portions in the thickness direction, respectively, first and second lower horizontal portions disposed to be spaced apart from the first and second upper horizontal portions, respectively, in a direction away from the first and second band portions, and first and second inclined support portions diagonally connecting the first and second upper horizontal portions and the first and second lower horizontal portions to each other, respectively; and first and second solders electrically connecting the first and second metal frames to the first and second electrode pads, respectively, wherein the first and second solders are spaced-apart from any of the first and second external electrodes of the multilayer ceramic capacitor, and contact with the first and second inclined support portions, respectively, and wherein in the first and second metal frames, the first and second inclined support portions are inclined in the width direction of the ceramic body.

10. A multilayer ceramic component comprising:

a multilayer ceramic capacitor including a plurality of first and second internal electrodes having respective dielectric layers interposed between the plurality of first and second internal electrodes, to be alternately exposed to opposite surfaces of a ceramic body in a length direction, and first and second external electrodes respectively including first and second connection portions formed on the opposite surfaces of the ceramic body in the length direction, and connected to the first and second internal electrodes, respectively, and first and second extended portions extended from the first and second connection portions, respectively, to cover portions of a third surface of the ceramic body which is parallel to the length direction; and first and second metal frames each having a Z-shape disposed, in a thickness direction of the ceramic body, on the first and second extended portions of the first and second external electrodes, respectively, wherein a diagonal portion of the Z-shape of each of the first and second metal frames is inclined in a width direction of the ceramic body.

11. The board of claim 9, further comprising first and second conductive adhesive layers disposed between the first and second surfaces of the first and second band portions in the thickness direction and the first and second upper horizontal portions, respectively.

12. The board of claim 11, wherein the first and second conductive adhesive layers are formed of a solder or a conductive paste.

13. The board of claim 9, wherein in the first and second metal frames, the first and second inclined support portions connect inner ends of the first and second upper horizontal portions in the length direction and outer ends of the first and second lower horizontal portions in the length direction to each other, respectively.

14. The board of claim 9, wherein in the first and second metal frames, the first and second inclined support portions connect outer ends of the first and second upper horizontal portions in the length direction and inner ends of the first and second lower horizontal portions in the length direction to each other, respectively.

15. The board of claim 9, wherein in the first and second metal frames, the first and second inclined support portions are inclined in the width direction of the ceramic body.

16. The board of claim 15, wherein the first and second inclined support portions are formed in directions opposing each other.

17. The board of claim 9, wherein the ceramic body includes a plurality of dielectric layers stacked in parallel with a direction in which the first and second metal frames are disposed.

18. The board of claim 17, wherein the ceramic body further includes cover layers disposed on a first or second internal electrode positioned at an uppermost side of the ceramic body and beneath a first or second internal electrode positioned at a lowermost side of the ceramic body, respectively.

19. The board of claim 9, wherein the ceramic body includes a plurality of dielectric layers stacked perpendicularly to a direction in which the first and second metal frames are disposed.

20. The board of claim 19, wherein the ceramic body further includes cover layers disposed on outer surfaces of outermost first or second internal electrodes of the ceramic body, respectively.

* * * * *